(12) United States Patent
Tu et al.

(10) Patent No.: US 10,270,065 B2
(45) Date of Patent: Apr. 23, 2019

(54) HEAT RADIATION STRUCTURE FOR ORGANIC LIGHT-EMITTING DEVICE AND DISPLAY APPARATUS

(71) Applicant: Shenzhen China Star Optoelectronics Technology Co., Ltd., Shenzhen, Guangdong (CN)

(72) Inventors: Aiguo Tu, Guangdong (CN); Jinchuan Li, Guangdong (CN); Feng Wei, Guangdong (CN); Liang Jiang, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 0 days.

(21) Appl. No.: 15/569,846

(22) PCT Filed: Jul. 6, 2017

(86) PCT No.: PCT/CN2017/092112
§ 371 (c)(1),
(2) Date: Oct. 27, 2017

(87) PCT Pub. No.: WO2019/000481
PCT Pub. Date: Jan. 3, 2019

(65) Prior Publication Data
US 2018/0375055 A1    Dec. 27, 2018

(30) Foreign Application Priority Data
Jun. 26, 2017  (CN) .......................... 2017 1 0494412

(51) Int. Cl.
*H01L 51/52*   (2006.01)
*H05K 7/20*    (2006.01)

(52) U.S. Cl.
CPC .......... *H01L 51/529* (2013.01); *H01L 51/524* (2013.01); *H01L 51/5271* (2013.01); *H05K 7/20963* (2013.01); *H01L 2251/301* (2013.01)

(58) Field of Classification Search
None
See application file for complete search history.

(56) References Cited

U.S. PATENT DOCUMENTS

2014/0103809 A1*  4/2014  Bang ..................... H01L 51/529
                                                                   315/113
2016/0027718 A1*  1/2016  Park .................... H01L 51/5237
                                                                   165/80.3
(Continued)

FOREIGN PATENT DOCUMENTS

CN    104218057 A    12/2014
CN    105097871 A    11/2015
(Continued)

*Primary Examiner* — Cheung Lee
(74) *Attorney, Agent, or Firm* — Mintz Levin Cohn Ferris Glovsky and Popeo, P.C.; Kongsik Kim; Jhongwoo Jay Peck

(57) ABSTRACT

The present disclosure provides a heat radiation structure for an organic light-emitting device, which includes a heat radiation plate and a thermal isolation layer disposed on a side surface of the heat radiation plate for insulating heat of a driving circuit of the organic light-emitting device. The present disclosure also provides a display apparatus, which includes a support frame and a panel disposed in the support frame, and also includes the heat radiation structure for the organic light-emitting device, wherein the heat radiation plate is disposed in the support frame and opposite to the panel, the thermal isolation layer is disposed on a side surface of the heat radiation plate away from the panel, the heat radiation plate forms a rear cover of the display (Continued)

apparatus, and a flexible circuit board of the panel is bent to a side surface of the thermal isolation layer away from the panel.

13 Claims, 1 Drawing Sheet

(56) References Cited

U.S. PATENT DOCUMENTS

2016/0073528 A1 3/2016 Park et al.
2017/0356837 A1* 12/2017 Kautzsch ............ G01N 15/1425

FOREIGN PATENT DOCUMENTS

| CN | 105098089 A | 11/2015 |
| CN | 105321979 A | 2/2016 |
| CN | 205303466 U | 6/2016 |

* cited by examiner

US 10,270,065 B2

HEAT RADIATION STRUCTURE FOR ORGANIC LIGHT-EMITTING DEVICE AND DISPLAY APPARATUS

CROSS-REFERENCES TO RELATED APPLICATIONS

This application is a U.S. national phase application, pursuant to 35 U.S.C. § 371, of PCT/CN2017/092112, filed Jul. 6, 2017, designating the United States, which claims priority to Chinese Application No. 201710494412.9, filed Jun. 26, 2017. The entire contents of the aforementioned patent applications are incorporated herein by this reference.

TECHNICAL FIELD

The present disclosure relates to an organic light-emitting device technology, and in particular to a heat radiation structure for an organic light-emitting device and a display apparatus.

BACKGROUND ART

An organic light-emitting display (OLED) device is known as a new practical technology of the next generation flat panel display because it has excellent characteristics of self-luminescence without backlight, high contrast, thin thickness, wide viewing angle, quick response, be available for flexible panels, wide applicable temperature range, and simple structure and processing procedure etc.

The OLED device has a structure consisting of an anode (ITO), a cathode, and an organic function layer sandwiched therebetween. The organic function layer includes HIL, HTL, EML, ETL, and the like.

To expand range of applications of the organic light-emitting device and commercialize the organic light-emitting device, a technology has been developed to increase efficiency of the organic light-emitting device and reduce driving voltage.

However, the OLED device is subject greatly to temperature, and if the OLED device was used to make a panel of a television, accelerated aging of the OLED device may be resulted when encountering a heat source, wherein the largest heat source comes from a driving circuit part, and generally, the driving circuit is loaded on a flexible printed board. At present, a rear cover of an OLED television is generally made of a heat radiation material, and the flexible circuit board is bent to a side of the rear cover away from the panel, thereby preventing heat being transferred to the panel, and the heat radiation material is good for internal heat dissipation, but it still cannot avoid influence on the OLED device by the heat from the driving circuit part. After a long use, brightness of the OLED device adjacent to the driving circuit part may be lower than that in other areas, this will influence the display effect.

SUMMARY

To overcome the above defects in the prior art, the present disclosure provides a heat radiation structure for an organic light-emitting device and a display apparatus, thereby prolonging the service life of the organic light-emitting device.

The present disclosure provides a heat radiation structure for an organic light-emitting device, which may include a heat radiation plate and a thermal isolation layer disposed on a side surface of the heat radiation plate for isolating heat of a driving circuit of the organic light-emitting device.

Further, the thermal isolation layer may include a thermal insulating layer and/or a reflective thermal insulating layer.

Further, the thermal isolation layer may include a thermal insulating layer and a reflective thermal insulating layer.

Further, the thermal insulating layer may be made of a thermal insulating material.

Further, the thermal insulating material may be a porous thermal insulating material or a fibrous thermal insulating material.

Further, the reflective thermal insulating layer may be made of a reflective thermal insulating material.

Further, the reflective thermal insulating layer may be aluminum foil.

Further, the thermal insulating material may be the porous thermal insulating material which is one of diatomite, expanded vermiculite, expanded perlite, foam clay and microporous calcium silicate.

The present disclosure also provides a display apparatus, which may include a support frame and a panel disposed in the support frame, and also include the heat radiation structure for the organic light-emitting device, wherein the heat radiation plate may be disposed in the support frame and opposite to the panel, the thermal isolation layer may be disposed on a side surface of the heat radiation plate away from the panel, the heat radiation plate may form a rear cover of the display apparatus, and the flexible circuit board of the panel may be bent to a side surface of the thermal isolation layer away from the panel.

Further, the panel may consist of the organic light-emitting devices.

Compared with the prior arts, the present disclosure disposes a thermal insulating layer on a side surface of the heat radiation plate away from the organic light-emitting device, to insulate the flexible circuit board that is bent to the side surface of the heat radiation plate away from the organic light-emitting device and the heat radiation plate, so that the heat radiated from the driving circuit on the flexible circuit board would not be conducted to the organic light-emitting device, thereby avoiding the problem on uneven brightness of the organic light-emitting device caused by the heat radiated from the driving circuit on the flexible circuit board, and prolonging the service life of the organic light-emitting device.

DETAILED DESCRIPTION OF EXEMPLARY EMBODIMENTS

Hereinafter, the present disclosure will be further explained with reference to the drawings and embodiments.

Figure 1:
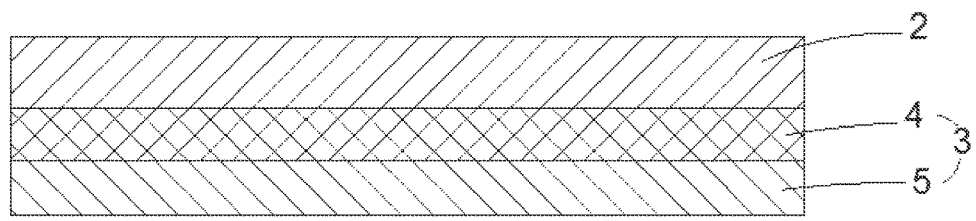
FIG. 1 is a structural diagram of a heat radiation structure for an organic light-emitting device of the present disclosure.

As shown in FIG. 1, the present disclosure discloses a heat radiation structure for an organic light-emitting device, which includes a heat radiation plate 2 and a thermal isolation layer 3 disposed on a side surface of the heat radiation plate 2 for insulating heat of a driving circuit of the organic light-emitting device, and the thermal isolation layer 3 and the heat radiation plate 2 are adhered to each other.

The thermal isolation layer 3 includes a thermal insulating layer 4 and/or a reflective thermal insulating layer 5. When the thermal isolation layer 3 includes a thermal insulating layer 4 and a reflective thermal insulating layer 5, the reflective thermal insulating layer 5 is disposed on a side surface of the thermal insulating layer 4 away from the heat radiation plate 2. In specific, a position at which the reflective thermal insulating layer 5 is disposed is opposite to a position of the driving circuit of the organic light-emitting device, and in particular, the driving circuit is sandwiched between the thermal insulating layer 4 and the reflective thermal insulating layer 5, and thus the heat radiated from the driving circuit can be insulated, thereby preventing the heat being conducted to the organic light-emitting device. If the heat is conducted to the organic light-emitting device, this will cause a part of the organic light-emitting device corresponding to the driving circuit to be heated, accelerate the aging rate of the part of the organic light-emitting device, and cause the brightness of the part of the organic light-emitting devices to be different from that of the rest part of the organic light-emitting devices, thereby resulting in uneven brightness, and meanwhile, it may also cause the service life of this part to be shorter than that of the rest part.

The thermal insulating layer 4 in the present disclosure is made of a thermal insulating material, in particular a porous thermal insulating material or a fibrous thermal insulating material. The reflective thermal insulating layer 5 is made of a reflective thermal insulating material, in particular aluminum foil. The heat radiation plate 2 includes a composite aluminium plate and a composite graphite sheet, which are disposed in a form of laminating. The thermal insulating material is selected from porous thermal insulating materials, in specific one of diatomite, expanded vermiculite, expanded perlite, foam clay and microporous calcium silicate.

Figure 2:
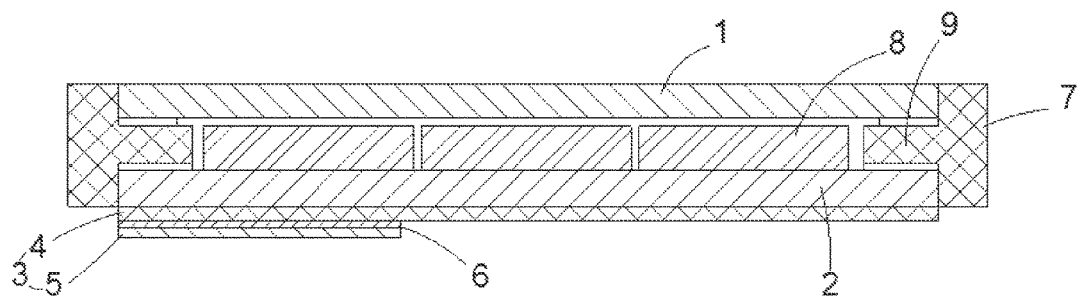
FIG. 2 is a structural diagram of a display apparatus of the present disclosure.

As shown in FIG. 2, the present disclosure also discloses a display apparatus, which includes a support frame 7 and a panel 1 disposed in the support frame 7, and also includes the aforementioned heat radiation structure for the organic light-emitting device, wherein the heat radiation plate 2 is disposed in the support frame 7 and opposite to the panel 1, the thermal isolation layer 3 is disposed on a side surface of the heat radiation plate 2 away from the panel 1, the heat radiation plate 2 forms a rear cover of the display apparatus, the rear cover being embedded in the support frame 7, a driving circuit 6 of the panel 1 is bent to be disposed on a side surface of the thermal isolation layer 3 away from the panel 1, here, the driving circuit 6 can be arranged on a flexible circuit board, and thus the driving circuit 6 can be adhered to the thermal isolation layer 3 by bending the flexible circuit board to a side surface of the thermal isolation layer 3 away from the panel 1.

In the present disclosure, the panel 1 consists of the organic light-emitting device that at least includes three light-emitting units.

The thermal isolation layer 3 includes a thermal insulating layer 4 and a reflective thermal insulating layer 5. The reflective thermal insulating layer 5 is disposed on a side surface of the thermal isolation layer 3 away from the heat radiation plate 2, and since the reflective thermal insulating layer 5 is used to further insulate the heat radiated from the driving circuit 6, an area of the reflective thermal insulating layer 5 is smaller than that of the thermal insulating layer 4, it only needs to be disposed at a position where the driving circuit 6 is. In specific, the position at which the reflective thermal insulating layer 5 is disposed corresponds to the position of the driving circuit 6, and in particular, the driving circuit 6 is sandwiched between the thermal insulating layer 4 and the reflective thermal insulating layer 5, and thus the heat radiated from the driving circuit 6 can be insulated, thereby preventing the heat being conducted to the panel 1. Since the panel consists of the organic light-emitting devices that include a plurality of light-emitting units, if the heat of the driving circuit is conducted to the light-emitting units here, this part of light-emitting units may be caused to be heated, thereby resulting in accelerating the aging rate of this part of light-emitting units, this may cause a problem on uneven brightness of the panel 1 and reduce the service life of the panel 1, and thus by insulating this part of heat of the driving circuit, it is possible to prevent the heat being conducted to the panel 1, thereby prolonging the whole service life of the panel 1.

The thermal insulating layer 4 is made of a thermal insulating material, in particular a porous thermal insulating material or a fibrous thermal insulating material. The reflective thermal insulating layer 5 is made of a reflective thermal insulating material, in particular aluminum foil. The heat radiation plate 2 includes a composite aluminium plate and a composite graphite sheet, which are disposed in a form of laminating. The thermal insulating material is selected from porous thermal insulating materials, in specific one of diatomite, expanded vermiculite, expanded perlite, foam clay and microporous calcium silicate.

As shown in FIG. 2, an interval is disposed between the panel 1 and the heat radiation plate 2, and a buffer cotton 8 is laid flat in the interval.

As shown in FIG. 2, protruding portions 9 are disposed around an inner hole of the support frame 7, for supporting the panel 1 and the heat radiation plate 2, so that the panel 1 and the heat radiation plate 2 are bonded and fixed on both side surfaces of the protruding portion 9 by a double-side adhesive tape. The buffer cotton 8 has a thickness the same as that of the protruding portion 9, thus a side surface of the buffer cotton 8 away from the panel 1 can be adhered to a side surface of the heat radiation plate 2 facing the panel 1.

Although the present disclosure is described with reference to the special exemplary embodiment, those skilled in the art will understand that various changes in form and details may be made therein without departing from the spirit and scope of the disclosure as defined by the appended claims and its equivalents.

What is claimed is:

1. A heat radiation structure for an organic light-emitting device, comprising:
   a heat radiation plate; and
   a thermal isolation layer disposed on a side surface of the heat radiation plate for insulating heat from a driving circuit of the organic light-emitting device,
   wherein the thermal isolation layer comprises a thermal insulating layer and a reflective thermal insulating layer.

2. The heat radiation structure of claim 1, wherein the thermal insulating layer is made of a thermal insulating material.

3. The heat radiation structure of claim 2, wherein the thermal insulating material is a porous thermal insulating material or a fibrous thermal insulating material.

4. The heat radiation structure of claim 3, wherein the thermal insulating material is the porous thermal insulating material which is one of diatomite, expanded vermiculite, expanded perlite, foam clay and microporous calcium silicate.

5. The heat radiation structure of claim 1, wherein the reflective thermal insulating layer is made of a reflective thermal insulating material.

6. The heat radiation structure of claim 5, wherein the reflective thermal insulating layer is aluminum foil.

7. A display apparatus, comprising a support frame and a panel disposed in the support frame, and further comprising a heat radiation structure for an organic light-emitting device, wherein the heat radiation structure for an organic light-emitting device comprises a heat radiation plate and a thermal isolation layer disposed on a side surface of the heat radiation plate for insulating heat from a driving circuit of the organic light-emitting device, the heat radiation plate being disposed in the support frame and opposite to the panel, the thermal isolation layer being disposed on a side surface of the heat radiation plate away from the panel, the heat radiation plate forming a rear cover of the display apparatus, and the driving circuit of the panel being disposed on a side surface of the thermal isolation layer away from the panel, wherein the thermal isolation layer comprises a thermal insulating layer and a reflective thermal insulating layer.

8. The display apparatus of claim 7, wherein the thermal insulating layer is made of a thermal insulating material.

9. The display apparatus of claim 8, wherein the thermal insulating material is a porous thermal insulating material or a fibrous thermal insulating material.

10. The display apparatus of claim 9, wherein the thermal insulating material is the porous thermal insulating material which is one of diatomite, expanded vermiculite, expanded perlite, foam clay and microporous calcium silicate.

11. The display apparatus of claim 7, wherein the reflective thermal insulating layer is made of a reflective thermal insulating material.

12. The display apparatus of claim 11, wherein the reflective thermal insulating layer is aluminum foil.

13. The display apparatus of claim 7, wherein the panel comprises the organic light-emitting device.

* * * * *